(12) United States Patent  (10) Patent No.: US 7,456,373 B2
Andersen et al.  (45) Date of Patent: Nov. 25, 2008

(54) WELDER WITH FRONT MOUNT FAN

(75) Inventors: Bryan P. Andersen, Cincinnati, OH (US); Jeffery J. Gadamus, Hortonville, WI (US)

(73) Assignee: Illinois Tool Works Inc., Glenview, IL (US)

( * ) Notice: Subject to any disclaimer, the term of this patent is extended or adjusted under 35 U.S.C. 154(b) by 177 days.

(21) Appl. No.: 11/160,023

(22) Filed: Jun. 6, 2005

(65) Prior Publication Data

US 2006/0274499 A1 Dec. 7, 2006

(51) Int. Cl.
*B23K 9/10* (2006.01)

(52) U.S. Cl. .................................... 219/130.1; 219/136

(58) Field of Classification Search ............. 219/130.1, 219/136
See application file for complete search history.

(56) References Cited

U.S. PATENT DOCUMENTS

| 5,747,773 | A  | * | 5/1998 | Griffin et al. | ............. | 219/130.1 |
| 6,888,099 | B1 | * | 5/2005 | Schneider | ................ | 219/130.1 |
| 6,926,497 | B2 | * | 8/2005 | Lin et al. | ................. | 415/213.1 |
| 7,005,608 | B2 | * | 2/2006 | Spear | ...................... | 219/130.1 |
| 2003/0228840 | A1 | * | 12/2003 | Gough et al. | ............... | 454/184 |

OTHER PUBLICATIONS

Miller Welding, Axcess Owner's Manual, Oct. 2003.
Miller Welding, Dynasty 300SD Owner's Manual, Sep. 2004.

* cited by examiner

*Primary Examiner*—Kevin P Kerns
(74) *Attorney, Agent, or Firm*—Ziolkowski Patent Solutions Group, SC

(57) ABSTRACT

A welding apparatus having an easily replaceable fan and a method of replacing the fan is disclosed. An opening is formed through the front panel of a welding-type power source to correspond to the profile of a cooling fan. The opening allows the cooling fan to pass therethrough unobstructed. Once inside the housing of the welding-type power source, the fan is positioned to generally occlude the opening and is then mounted to an inner surface of the front panel by a fastener secured through the front panel and into the fan.

21 Claims, 6 Drawing Sheets

WELDER WITH FRONT MOUNT FAN

BACKGROUND OF THE INVENTION

The present invention relates generally to welding apparatus, and more specifically, to a method and apparatus having a fan for a welding-type device insertable through the front panel of the device housing. The front panel has an opening formed to permit a fan to pass therethrough.

A known method for cooling internal components of a welding-type power source involves forcing outside air through a cooling vent or wind tunnel formed within a welding-type device. Welding-type power sources incorporating this feature are normally configured so that internal heat sinks are disposed in the vent or tunnel, and thus, within the path of the forced air. Therefore, a fan is commonly employed at one end of the vent or tunnel to force air through the power source. It is known and desirable to attach such a fan inside the housing of the power source so that all power source components are attached within a common housing. Also, a welding-type power source is stored and transported more conveniently when all components are positioned within a common, uniformly-shaped housing.

However, accessing a fan installed within the housing of a welding-type apparatus, for maintenance or replacement, can involve a considerable amount of removing and/or disconnecting components from the power source to reach the fan. Likewise, in some welding-type power sources, accessing components disposed within the cooling vent or tunnel may also require the same removing and disconnecting of components. The complexity involved in such maintenance can detract from the efficiency of a welding process or routine maintenance by increasing the time required to perform a simple task such as removing a cooling fan.

For example, previous models of welding-type power sources required that the top and side panels of the power source housing be removed. Then, a series of components had to be disconnected from the side of the unit so that the fan could be accessed and removed. Under this method, removing a fan required familiarity with multiple removal steps, keeping track of the various components, and then reconnecting the components in reverse order. This creates an increased likelihood that screws or other more important components will be misplaced, lost, or not reinstalled correctly, and is a rather time-consuming task.

Other welding-type power sources addressed these problems by providing for the fan to be removed from the front of the power source. A welding-type power source incorporating this type of fan installation is shown in FIG. 2. Removal of the fan in this configuration requires 1) removing the front grill, 2) unscrewing several fasteners to remove the entire front panel, 3) either disconnecting wires from the front panel to a circuit board and separating the circuit board from the front panel or disconnecting wires from the circuit board to the power source and separating the circuit board from the power source, and 4) disconnecting the fan. Understandably, this necessitates both an undesirable amount of time and a thorough knowledge of the wire connections within the power source.

It would therefore be desirable to have an apparatus and method for easily and quickly removing or installing a cooling fan in a welding-type power source with a minimal number of steps. Such an apparatus and method would allow replacement of the fan by less than highly experienced technicians.

BRIEF DESCRIPTION OF THE INVENTION

The present invention provides an apparatus and method for installing or removing a cooling fan of a welding-type power source. The fan is inserted or removed through an opening formed in the front panel of the power source housing. The opening is shaped to correspond to a profile of the fan, so that the fan can pass through the opening and still allow the fan to be mounted to an inner surface of the front panel.

Therefore, in accordance with one aspect of the present invention, a welding-type apparatus is provided having a welding-type power source capable of generating a welding-type power, a fan assembly having a threaded opening, a front panel, and at least one fastener. The front panel is connected to the welding-type power source and has an opening sized to permit passage of the fan assembly therethrough. The front panel is constructed to allow mounting of the fan assembly to at least one fastening slot extending radially outward from the opening in the back surface of the front panel. The at least one fastener extends through the at least one fastening slot of the front panel and into the threaded opening of the fan assembly.

According to another aspect of the present invention, a method is provided for manufacturing a welding-type apparatus. The method comprises providing a welding-type power source capable of generating a welding-type power, providing a front panel, forming an opening through the front panel to have a profile corresponding substantially to that of a fan to permit passage of the fan therethrough, and affixing the front panel to the welding-type power source. This process allows inserting the fan through the opening of the front panel and mounting the fan on an inward-facing surface of the front panel with at least one mounting fastener inserted from the front panel and into the fan.

In accordance with yet another aspect of the present invention, a welding-type device is disclosed having a welding-type power source and a front panel attached thereto. The front panel has an orifice formed therein, the orifice being substantially free of protrusions and sized to allow a fan to be inserted therethrough and to be attached to the front panel in a position generally coextensive with the orifice.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 3A is a side view of the grill of the welding-type apparatus.

DETAILED DESCRIPTION OF THE PREFERRED EMBODIMENT

As one skilled in the art will fully appreciate, any description of welding-type devices provided herein not only includes welders, but also includes any system that requires high power outputs, such as heating and cutting systems. Therefore, the present invention is equivalently applicable with any device requiring high power output, including welders, plasma cutters, induction heaters, aircraft ground power units, and the like. Reference to welding power, welding-type power, or welders generally, includes welding, cutting, heating power, or ground power for aircraft. Description of a welding apparatus illustrates just one embodiment in which the present invention may be implemented.

Figure 1:
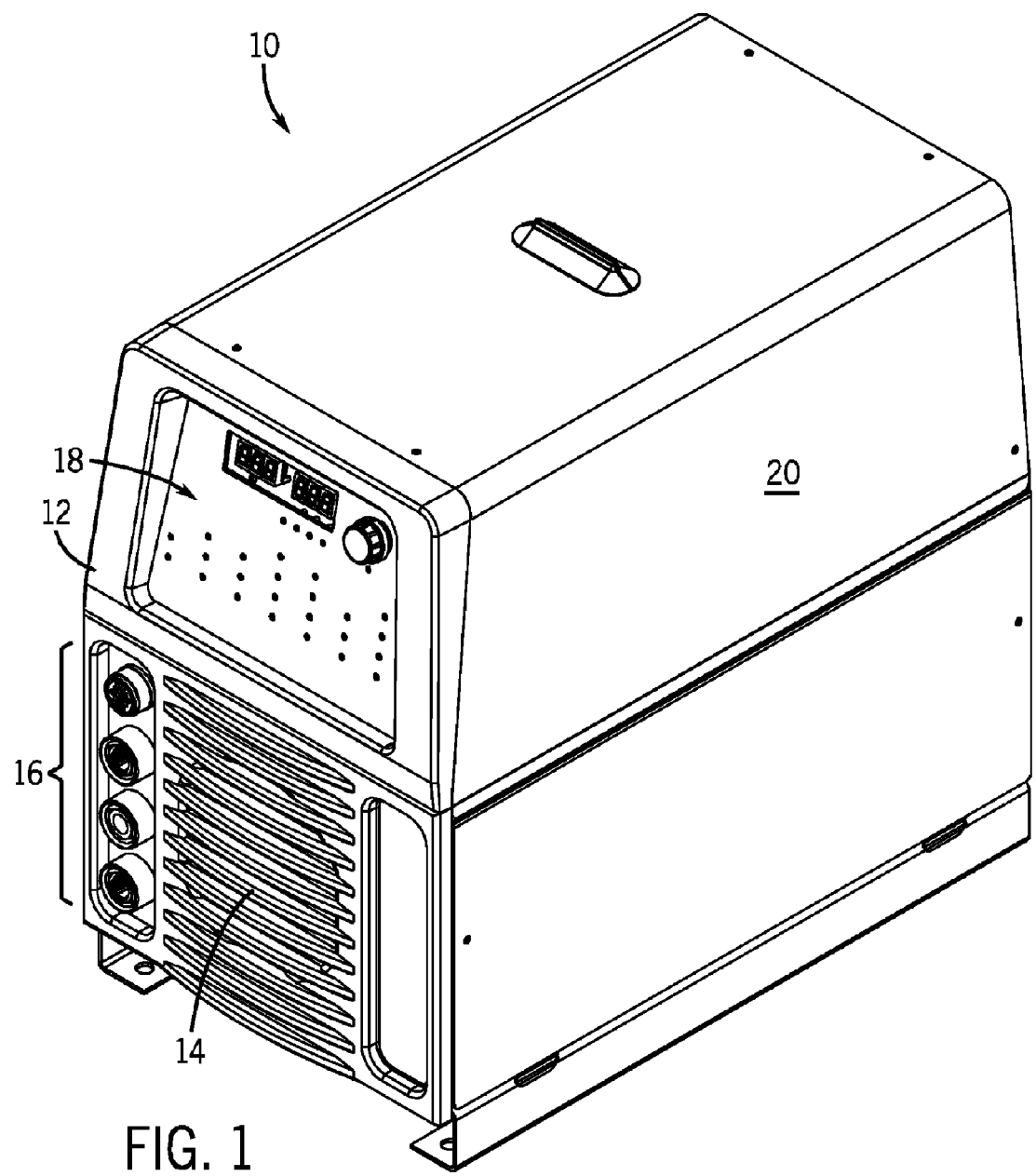
FIG. 1 is a perspective view of a welding-type apparatus according to the present invention.

Referring now to FIG. 1, a welding-type power source 10 is shown in accordance with the present invention. Power source 10 is housed within top cover 20 and outer bezel 12. When outer bezel 12 is attached to power source 10, control panel 18 and receptacles 16 are accessible by a user, although the control panel 18 and receptacles 16 are attached to an inner front panel (not shown) of power source 10. That is, outer bezel 12 does not completely cover the inner front panel (not shown) of power source 10. Outer bezel 12 also allows airflow access to the internal components of power source 10 through grill 14 via an opening in the inner front panel (not shown).

Figure 2:
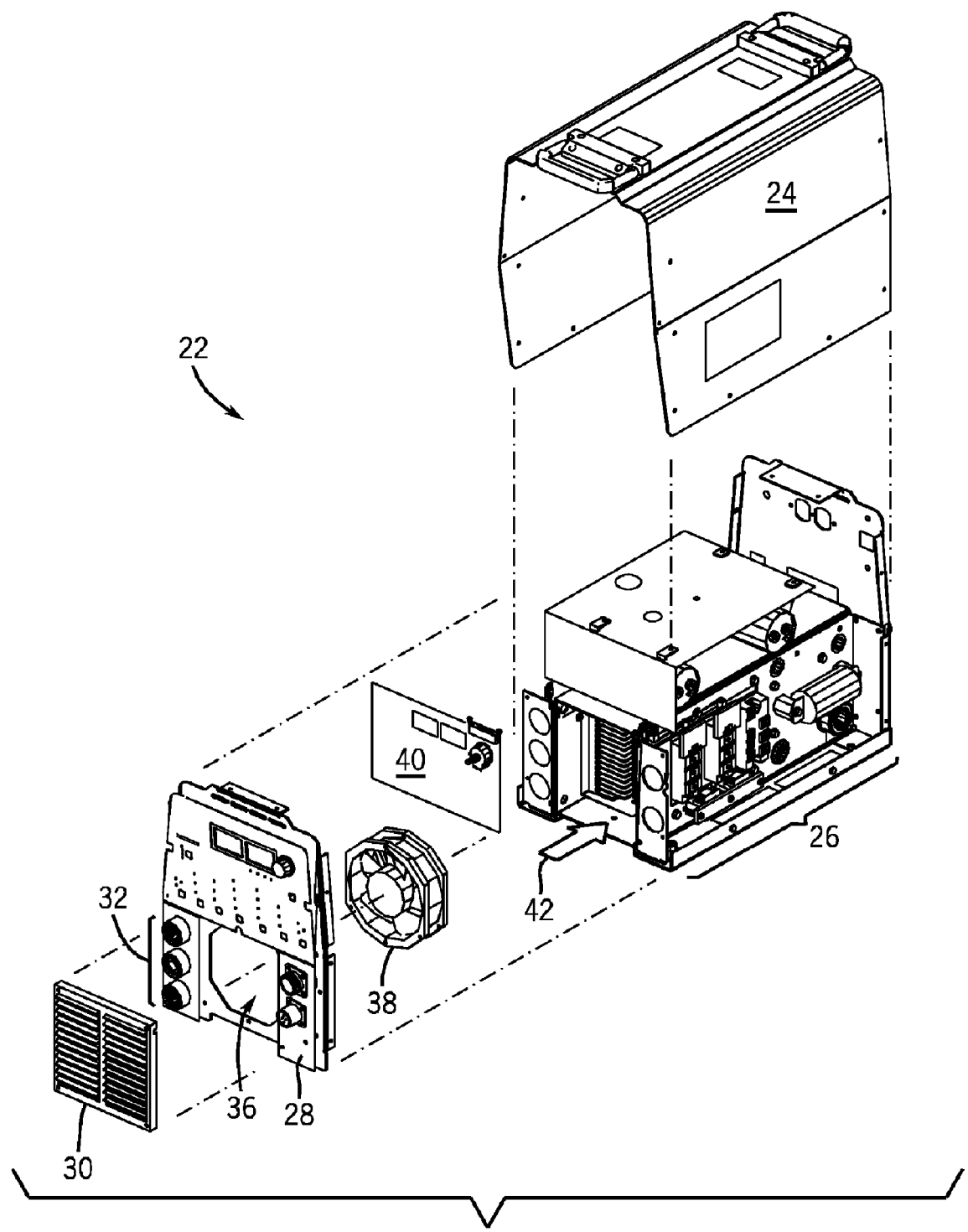
FIG. 2 is a prior art welding-type apparatus in an exploded view.

In comparison, FIG. 2 shows an exploded view of a welding-type power source 22 according to the known art. Specifically, top cover 24 of known power source 22 has been removed, exposing the internal components 26 of known power source 22. Front panel 28 and grill 30 have been removed, and fan 38 and circuit board 40 have been disconnected. As can be seen, power source 22 utilizes a single front panel 28, rather than inner and outer front panels, as discussed above with respect to the one aforementioned embodiment of the present invention. The single front panel 28 has an opening formed therethrough for allowing external air to flow into power source 22. When power source 22 is fully assembled, grill 30 is attached to the outer surface of front panel 28, circuit board 40 is connected to the rear surface of front panel 28, front panel 28 is secured to the front of power source 22, and top cover 24 is installed over the top of power source 22. In operation, fan 38 draws air into the power source 22 through the grill 30 and the opening 36 in single front panel 28. Fan 38 forces this flow of air through a vent or tunnel 42 formed through the center of the power source 22 for cooling.

Therefore, when a user desires to install, remove, or replace fan 38 of known power source 22, multiple steps must be taken to access the fan. First, top cover 24 must be removed from power source 22. Grill 30 must be unscrewed from front panel 28 so that a user has complete access to front panel 28. This often involves the removal of at least four or more fasteners. Then, front panel 28 must be unscrewed from power source 22, usually requiring the removal of about eight screws. Front panel 28 may then be partially separated from the internal components 26 of power source 22. However, any internal components connected to the gas line and torch cable receptacles 32 must be disconnected from the front panel 28 before the panel can be fully detached from the power source 22. Additionally, a series of wires (not shown) still connect front panel 28 to the internal components 26 via circuit board 40. That is, circuit board 40 is attached to the rear face (not shown) of front panel 28 and has several control and power wires which connect it to various components of the power source 22. Therefore, either circuit board 40 must be disconnected from front panel 28 or the wires (not shown) must be disconnected from circuit board 40. In either case, once the wires no longer restrain front panel 28, the panel can be fully separated from the rest of power source 22. This allows access to both vent tunnel 42 and any components disposed therein, and to the fan 38, which is attached to the rear face (not shown) of front panel 28.

Figure 3:
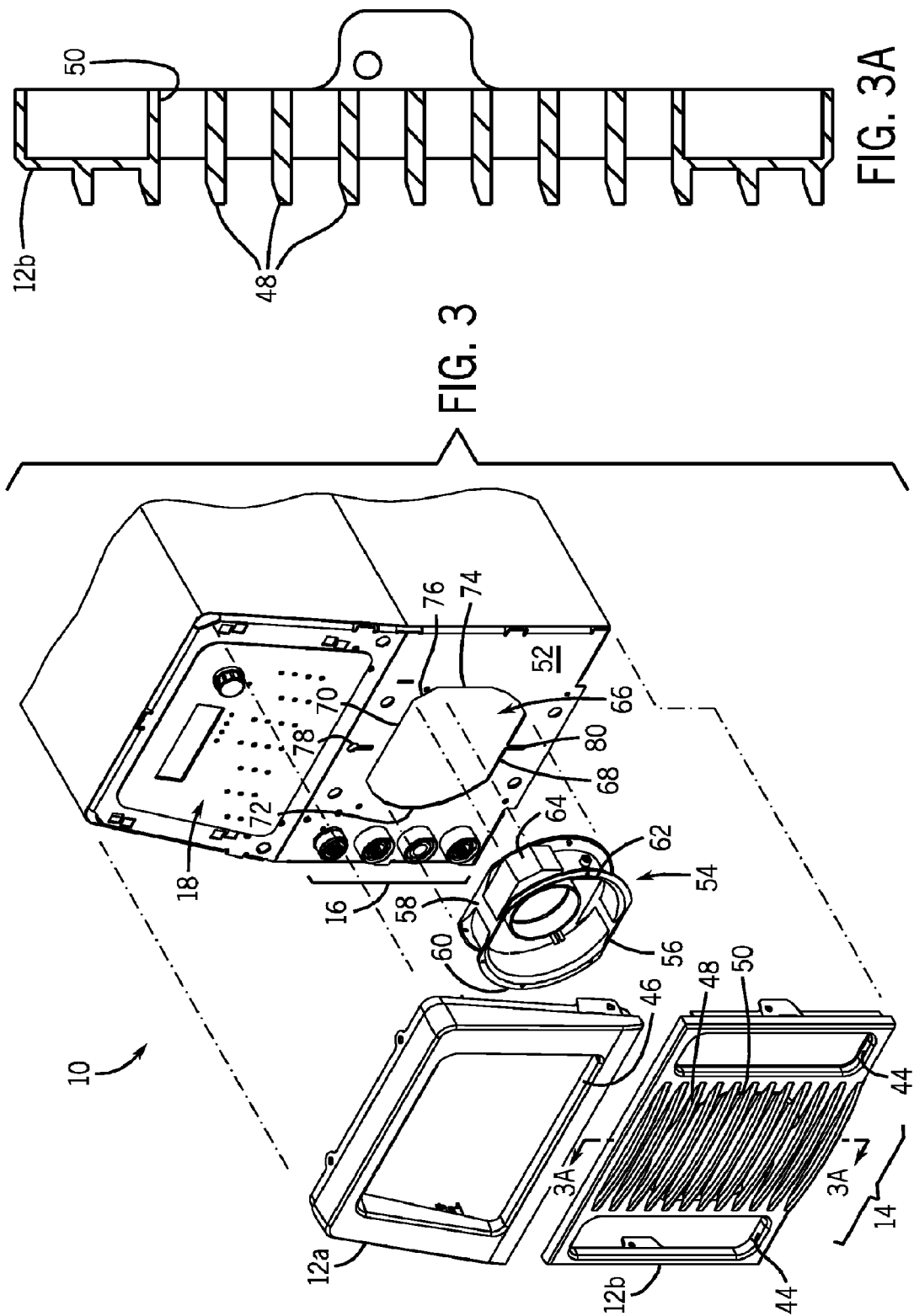
FIG. 3 is a partial view of the welding-type apparatus of FIG. 1 in exploded view.

Referring now to FIG. 3, an exploded view of a portion of the welding-type power source of FIG. 1 is shown incorporating the present invention. In the embodiment depicted, outer bezel 12 has an upper portion 12a and a lower portion 12b. While both portions 12a and 12b are shown removed from power source 10, it is recognizable that gaining access to fan 54 would require that only the lower portion 12b of the outer panel be removed. Alternatively, outer front panel 12 may comprise one contiguous panel. In either case, as discussed above, the outer front panel 12 allows control panel 18 and receptacles 16 to be accessed by a user when the outer front panel 12 is attached to inner front panel 52. Specifically, the upper portion 12a has a window 46 through which a user may view and operate control panel 18. Lower portion 12b has two side windows 44 through which receptacles 16 may be accessed for connection with gas lines and welding torch cables (not shown). However, it is understood that any configuration, orientation, or number of windows may be formed in outer bezel 12 to accommodate various positionings of these or other controls and receptacles as needed. Additionally, grill 14 of outer bezel 12 allows airflow passage therethrough. As depicted, grill 14 is comprised of a series of horizontal slats 48 spaced over a circular baffle 50 to form a vent. Appreciably, there are many known and suitable mechanisms which may be used in place of grill 14 to direct the flow of air into power source 10, such as mesh or fibrous filters or screens. Preferably, outer front panel 12, or upper and lower portions 12a, 12b thereof, may be formed of a rigid plastic. However, one of ordinary skill in the art will recognize that many suitable materials may be used.

Fan 54 is also shown removed from power source 10. As can be seen, fan 54 has a generally symmetrical, geometrical cross section with flat bottom and top sides 56, 58 and semi-circular tabs 60, 62 extending therefrom on either side of fan 54. As depicted, semi-circular tabs 60, 62 appear as protracted flanges. However, it is understood that tabs 60, 62 may also be solid or non-circular or may extend from only a portion of the sides of fan 54. In addition, another tab or protrusion 64 is shown extending from the periphery of fan 54. In one embodiment, protrusion 64 may be used for connecting a power cord (not shown) to fan 54, however, it is also understood that tabs or protrusions such as that shown could be used in addition to, or in place of tabs 60, 62, for connecting fan 54 to inner front panel 52. Therefore, a cross section or profile of fan 54 may be considered generally rectangular with rounded tabs 60, 62 and protrusion 64 extending therefrom. However, in other embodiments, fan 54 may be generally elliptical, circular, or rectangular and may have more protrusions or no protrusions. In the embodiment shown, the widest profiles of fan 54 are the cross sections of the front and back faces of fan 54 (i.e. in the vertical plane as depicted). Also, due to the semi-circular tabs 60, 62, the height of the fan 54 is less than a width of the fan, as depicted.

When outer bezel 12 is removed, inner front panel 52 is exposed. As visible in FIG. 3, inner front panel 52 has a control panel 18 and several receptacles 16 formed thereon. The orifice, or opening 66, formed through inner front panel 52 is shaped to allow fan 54 to pass therethrough. In the embodiment shown, opening 66 is shaped to be complementary to the cross-section of fan 54 so that fan 54 can pass through front panel 52 when the widest profile of fan 54 is parallel to the plane of front panel 52. In this regard, opening 66 has generally flat bottom and top edges 68, 70, and rounded side edges 72, 74. Also, opening 66 is shown having an irregular projection 76 in its upper right corner to complement the protrusion 64 of fan 54. The height of opening 66 is less than the width of opening 66, to correspond to the shape of fan 54 in the orientation depicted.

Outer bezel 12 also has an upper fastening aperture, or slot 78, and a lower fastening aperture, or slot 80, formed therein. As shown, slots 78, 80 extend generally radially outward from opening 66. It is understood that slots 78, 80 need not extend perfectly radially from opening 66, so long as they are disposed outside the general perimeter or contour of opening 66, such that opening 66 is free of protrusions or obstructions. Slots 78, 80 are provided so that a fastener may pass through front panel 52 and attach fan 54 to the back surface of front panel 52, inside welding-type power source 10.

Functionally, opening 66 is shaped as described above to complement the shape of fan 54 and vice versa. Therefore, fan 54 can pass through opening 66 when its front face is parallel to the plane of inner front panel 52. In other words, opening 66 is shaped to allow the widest profile of fan 54 to pass therethrough unobstructed.

Figure 4:
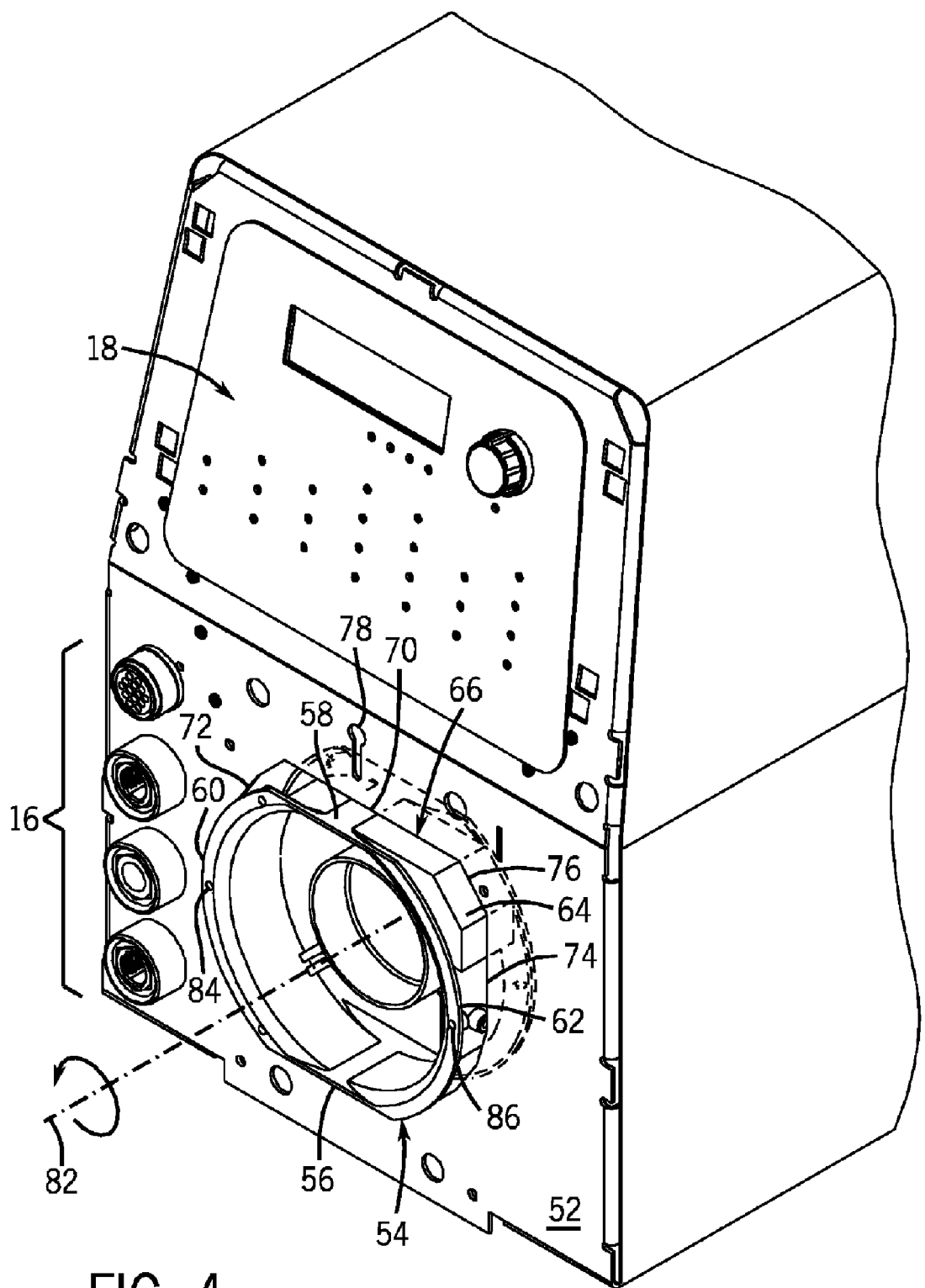
FIG. 4 is a partial view of the welding-type apparatus of FIG. 3 depicting insertion of a fan therein.

Referring now to FIG. 4, a partial view of the welding-type power source of FIG. 1 is shown with fan 54 shown partially inserted through opening 66. In a preferred embodiment, as is apparent from the drawing, the cross section of the fan 54 and the shape of the opening 66 complement one another closely. However, it is appreciated that opening 66 could be proportionately larger than the cross section of fan 54 to allow for space between fan 54 and the edges of opening 66 during insertion. Also, opening 66 could have some deviations from the shape of the corresponding fan 54 or vice versa. In any event, opening 66 must permit fan 54 to pass therethrough unobstructed. To complete installation, fan 54 is inserted completely through front panel 52, and then rotated so that the mounting points, or threaded fastener holes 84, 86 of the semi-circular tabs 60, 62 will be aligned with fastening slot 78 and slot 80 (not shown). As mentioned above, a width of fan 54 is greater than the height of fan 54. Therefore, in the embodiment depicted, the distance between flat sides 56, 58 (a height) is less than the distance between the outermost edges of tabs 60, 62 (a width). Accordingly, when fan 54 is rotated inside power source 10, tabs 60, 62 will be positioned behind and abutting front panel 52. That is, when fan 54 is rotated about longitudinal axis 82, its cross section will no longer be orientated correspondingly with the shape of opening 66.

In a preferred embodiment, fastening slot 78 is configured to allow a fastener to pass therethrough to mount fan 54 to front panel 52. A screw or other fastener is inserted through slot 78 to engage one of the threaded screw holes 84, 86 formed on tabs 60, 62 of fan 54. As will be described in further detail below, the shape of slot 78 also allows for a fastener to be partially threaded into one of the threaded screw holes 84, 86 of fan 54 prior to fan 54 being inserted through opening 66. Additionally, it is understood that other means may be employed to attach fan 54 to inner front panel 52. For example, rather than employing threaded screw holes 84, 86 on tabs 60, 62 of fan 54, snap lock tabs could be used to engage an appropriately shaped fastening slot of front panel 52.

Figure 5:
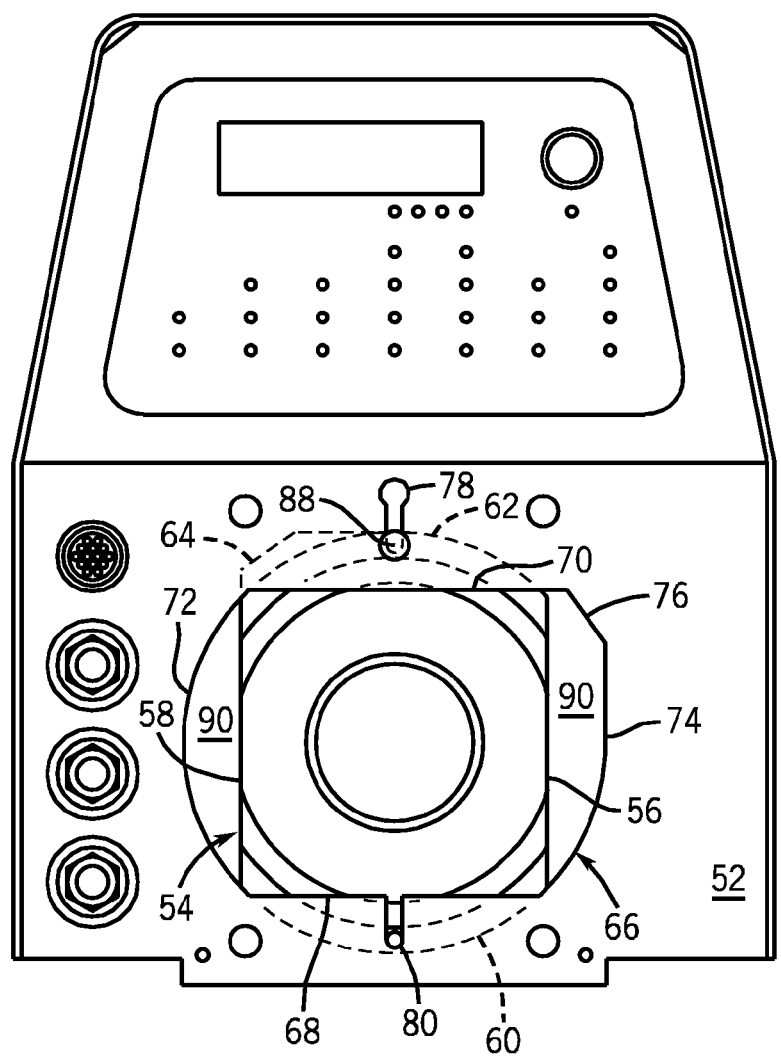
FIG. 5 is a front view of the welding-type apparatus of FIG. 4 with the fan inserted therein.

Referring now to FIG. 5, a front view of the partially assembled welding-type apparatus of FIG. 1 is shown. Specifically, fan 54 has been inserted through inner front panel 52, rotated to align threaded screw hole 86 of tab 62 with fastening slot 78, and secured with fastener 88. Irregular protrusion 64 can be seen, partially in phantom, extending from fan 54 behind inner front panel 52. Also, tab 62 can be seen in phantom behind inner front panel 52 at a top position, since fan 54 was rotated in a counter-clockwise direction. Thus, tab 60 is now seen in phantom at a bottom position behind inner front panel 52. Understandably, the power source 10, fan 54, and opening 66 may be configured to allow clockwise rotation, counter-clockwise rotation, or a combination of both.

As can be seen, fan 54 is attached to the back surface of front panel 52, generally coextensively with opening 66. Thus, opening 66 is generally occluded or covered by fan 54, although there are side portions 90 of opening 66 which remain uncovered. To improve the ability of fan 54 to create airflow through the welder, in a preferred embodiment, these gaps are covered by outer front bezel 12 or bottom portion 12b thereof. Therefore, as shown in FIG. 3, grill 14 comprises a round baffle 50 covered by horizontal slats 48. The profile of baffle 50 corresponds to the circumference of the blades (not shown) of fan 54, and is therefore smaller than the cross-section of fan 54 and the profile of opening 66. Therefore, when power source 10 is fully assembled, opening 66 is substantially covered by fan 54 and partially covered by outer front bezel 12 (or bottom portion 12b thereof).

Figure 6:
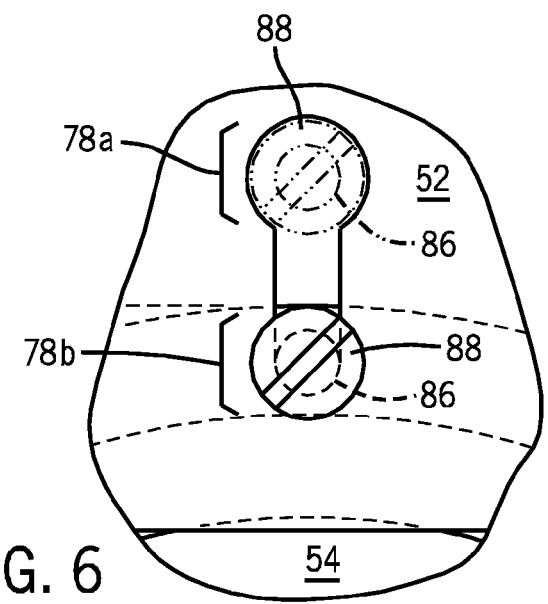
FIG. 6 is a detailed view of a fastening feature of the welding-type apparatus of FIG. 5.

Referring now to FIG. 6, a more detailed view of a preferred embodiment of fastening slot 78 with fastener 88 attached therethrough is shown. Fastening slot 78 comprises an upper, elliptical portion 78a and a lower, attenuated portion 78b, therefore appearing generally pear-shaped. Accordingly, if desired, a fastener may be partially threaded into a threaded screw hole 86 before fan 54 is inserted through opening 66. Then, the head of fastener 88 (seen in phantom) may pass through upper portion 78a of fastening slot 78, and the fan 54 may be adjusted downwards such that the head of fastener 88 slides into attenuated portion 78b and engages inner front panel 52 as shown. Alternatively, fan 54 could be inserted through opening 66 without a fastener already attached. Fan 54 would then be rotated such that a threaded screw hole 84, 86 (not shown) is aligned with fastening slot 78, and a fastener could be inserted through attenuated portion 78b of fastening slot 78 and secured into one of threaded screw holes 84, 86 (not shown).

Figure 7:
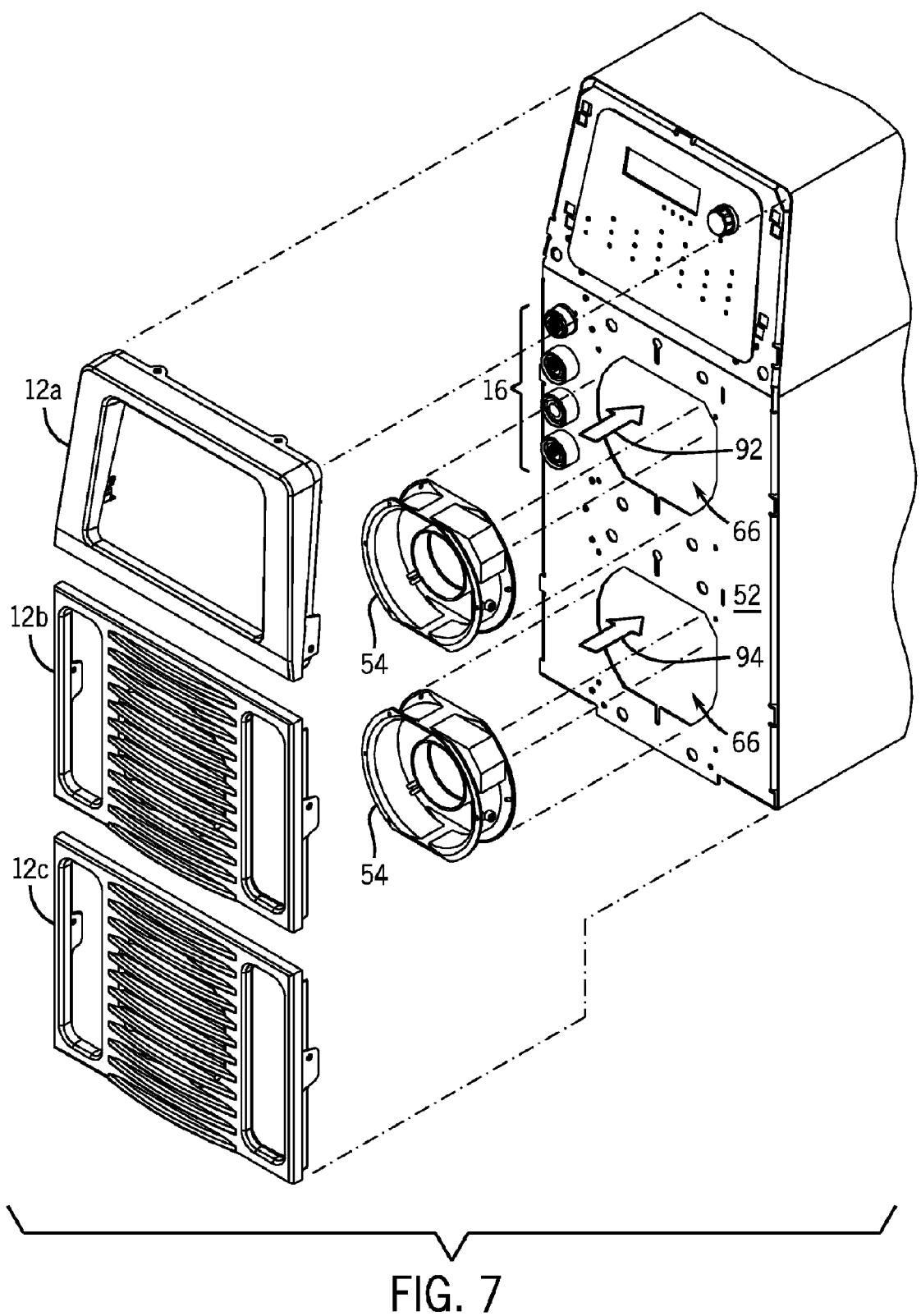
FIG. 7 is an exploded partial view of another welding-type apparatus.

FIG. 7 depicts an exploded view of another embodiment of the present invention, having dual vent tunnels 92, 94. Vent tunnels 92, 94 are disposed in a stacked, vertical alignment, and pass through power source 10 to achieve cooling, as discussed above with respect to other embodiments of the present invention. Accordingly, two fans 54 are provided and two openings 66 are formed through inner front panel 52. The two fans 54 are substantially identical to one another in the embodiment shown, as are the two openings 66. However it is understood that the sizes, shapes and positions of fans 54 and openings 66 may differ so long as openings 66 permit corresponding fans 54 to pass therethrough and to be attached to inner front panel 52 to generally occlude openings 66. Fans 54 may be attached to the back surface (not shown) of inner front panel 52 according to the fastening method described above. Additionally, outer front panel 12 is depicted having three segments, upper and lower portions 12a, 12b as described above, and a second lower portion 12c. Second lower portion 12c is substantially identical to lower portion 12b, and is configured to be attached to inner front panel 52 to partially cover the lower opening 66 as discussed above with respect to lower portion 12b. Therefore, in power sources generating a higher output or otherwise requiring increased cooling capability, the embodiment depicted in FIG. 7 provides two fans 54 and openings 66 so that dual vent tunnels 92, 94 may be employed.

Accordingly, it has been shown that the present invention provides for a simpler and more efficient method and apparatus for installing and removing a cooling fan of a welding-type device. When an opening is formed in the front panel of a welding-type device to complement the shape of a cooling fan such that the cooling fan may pass therethrough unobstructed, a less complex manner of removing and installing the fan may be achieved, involving a reduced amount of component removal and disconnection. For installation, the fan is inserted through the opening, then positioned so that a connection point of the fan is aligned with a mounting hole formed through the front panel. The fan is then fastened to the panel. For removal, the fan is unfastened, then removed through the opening of the front panel.

Therefore, a welding-type apparatus is provided comprising a welding-type power source capable of generating a welding-type power, a fan assembly having a threaded opening, a front panel, and at least one fastener. The front panel is connected to the welding-type power source, has front and back surfaces, an opening sized to permit passage of the fan assembly therethrough, and at least one fastening slot extending radially outward from the opening. The front panel is constructed to allow mounting of the fan assembly to the back surface of the front panel. The at least one fastener extends through the at least one fastening slot of the front panel and into the threaded opening of the fan assembly.

The present invention also includes a method for manufacturing a welding-type apparatus. The method comprises providing a welding-type power source capable of generating a welding-type power, providing a front panel, forming an opening through the front panel to have a profile corresponding substantially to that of a fan to permit passage of the fan therethrough, affixing the front panel to the welding-type power source, inserting the fan through the opening of the front panel, and mounting the fan on an inward-facing surface of the front panel with at least one mounting fastener inserted from the front panel and into the fan.

According to a further aspect of the present invention, a welding-type device comprises a welding-type power source and a front panel attached thereto. The front panel has an orifice formed therein, the orifice being substantially free of protrusions and sized to allow a fan to be inserted therethrough and to be attached to the front panel in a position generally coextensive with the orifice.

The present invention has been described in terms of the preferred embodiment, and it is recognized that equivalents, alternatives, and modifications, aside from those expressly stated, are possible and within the scope of the appending claims.

What is claimed is:

1. A welding-type apparatus comprising:
   a welding-type power source capable of generating a welding-type power;
   a fan assembly having a threaded opening therein;
   a front panel connected to the welding-type power source, the panel having a front surface and a back surface, an opening therethrough sized to permit passage of the fan assembly through the front panel, and at least one fastening slot extending radially outward from the opening, the front panel constructed to allow mounting of the fan assembly to the back surface of the front panel; and
   at least one fastener extending through the at least one fastening slot of the front panel and into the threaded opening of the fan assembly.

2. The welding-type apparatus of claim 1 wherein a width of a front face of the fan assembly is greater than a height of the front face of the fan assembly.

3. The welding-type apparatus of claim 1 wherein the opening has at least one oblong side.

4. The welding-type apparatus of claim 3 wherein the fan assembly has at least one tab extending outwardly therefrom.

5. The welding-type apparatus of claim 4 wherein the at least one fastening slot is disposed outside a general contour of the opening.

6. The welding-type apparatus of claim 5 wherein the fastening slot has an elliptical portion and an attenuated portion.

7. The welding-type apparatus of claim 1 wherein the opening is shaped to permit passage of the fan assembly when a front face of the fan assembly is parallel to the front surface of the front panel.

8. The welding-type apparatus of claim 1 wherein the fan assembly is secured to the front panel at no more than two mounting points, the mounting points being disposed generally opposite one another about the opening.

9. A method of manufacturing a welding-type apparatus comprising:
   providing a welding-type power source capable of generating a welding-type power;
   providing a front panel;
   forming an opening through the front panel to have a profile corresponding substantially to that of a fan assembly to permit passage of the fan assembly therethrough;
   affixing the front panel to the welding-type power source;
   inserting the fan assembly through the opening of the front panel; and
   mounting the fan assembly on an inward-facing surface of the front panel with at least one mounting fastener inserted from the front panel and into the fan assembly.

10. The method of claim 9 further comprising the step of constructing the fan assembly to have one of a generally elliptical and generally rectangular cross-section with at least one flange extending outwardly therefrom.

11. The method of claim 10 wherein the opening is formed having at least one irregular projection such that the shape of the opening is substantially complementary to the cross-section of the fan assembly.

12. The method of claim 11 further comprising the step of forming at least one mounting aperture through the front panel and outward from the opening.

13. The method of claim 12 wherein the at least one mounting aperture is formed outside a general perimeter of the opening a radial distance from the at least one irregular projection.

14. The method of claim 13 wherein the step of mounting the fan assembly further includes:
   after inserting the fan assembly through the opening, rotating the fan assembly to align the at least one flange of the fan assembly with the at least one mounting aperture of the front panel; and
   attaching the fan assembly to the front panel by securing a fastener through the aperture to the flange.

15. The method of claim 9 wherein the fan assembly is mounted with no more than two fasteners and in a position to facilitate communication with a vent portion of the welding-type apparatus.

16. A welding-type device comprising:
   a welding-type power source;
   a front panel attached to the welding-type power source and having an orifice formed therein; and
   at least one mounting slot formed on the front panel, extending outwardly from the orifice, wherein the orifice is substantially free of protrusions and sized to allow a fan to be inserted therethrough and to be attached to the front panel in a position generally coextensive with the orifice.

17. The welding-type device of claim 16 wherein a cross-section of the fan and a profile of the orifice are generally complementary.

18. The welding-type device of claim 16 wherein the fan is a fan assembly.

19. The welding-type device of claim 18 wherein the at least one mounting slot is a pear-shaped aperture.

20. The welding-type device of claim 19 wherein the fan is attached to the front panel by at least two fastenings, at least one being a screw secured through the pear-shaped aperture to a tab of the fan.

21. The welding-type device of claim 16 comprising two orifices in the front panel and two fans attached thereto, each fan positioned generally coextensive with an orifice.

* * * * *